United States Patent
Adetutu et al.

(10) Patent No.: US 6,790,719 B1
(45) Date of Patent: Sep. 14, 2004

(54) PROCESS FOR FORMING DUAL METAL GATE STRUCTURES

(75) Inventors: Olubunmi O. Adetutu, Austin, TX (US); Eric D. Luckowski, Round Rock, TX (US); Srikanth B. Samavedam, Austin, TX (US); Arturo M. Martinez, Jr., Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 122 days.

(21) Appl. No.: 10/410,043

(22) Filed: Apr. 9, 2003

(51) Int. Cl.[7] .............................................. H01L 21/337
(52) U.S. Cl. ...................... 438/195; 438/216; 438/233; 438/199
(58) Field of Search ................................. 438/199, 216, 438/218, 233, 195, 203

(56) References Cited

U.S. PATENT DOCUMENTS

| | | | |
|---|---|---|---|
| 6,171,959 B1 * | 1/2001 | Nagabushnam | 438/683 |
| 6,214,681 B1 * | 4/2001 | Yu | 438/300 |
| 6,417,104 B1 | 7/2002 | Hu | |
| 6,444,512 B1 | 9/2002 | Madhukar | |
| 6,492,217 B1 * | 12/2002 | Bai et al. | 438/199 |
| 2002/0151125 A1 * | 10/2002 | Kim et al. | 438/199 |

* cited by examiner

Primary Examiner—Hsien Ming Lee
(74) Attorney, Agent, or Firm—James L. Clingan, Jr.; Joanna G. Chiu

(57) ABSTRACT

A semiconductor device has a P channel gate stack comprising a first metal type and a second metal type over the first metal type and an N channel gate stack comprising the second metal type in direct contact with the a gate dielectric. The N channel gate stack and a portion of the P channel gate stack are etched by a dry etch. The etch of P channel gate stack is completed with a wet etch. The wet etch is very selective to the gate dielectric and to the second metal type so that the N channel transistor is not adversely effected by completing the etch of the P channel gate stack.

24 Claims, 4 Drawing Sheets

PROCESS FOR FORMING DUAL METAL GATE STRUCTURES

FIELD OF THE INVENTION

This invention relates to making integrated circuits using metal gates, and more particularly, to making integrated circuits using metal gates of differing structures.

RELATED ART

As semiconductor devices continue to scale down in geometry, the conventional polysilicon gate is becoming inadequate. One problem is relatively high resistivity and another is depletion of dopants in the polysilicon gate in the location near the interface between the polysilicon gate and gate dielectric. To overcome these deficiencies of polysilicon, metal gates are being pursued as an alternative. For desired functioning of the P channel transistors and the N channel transistors, the work functions of the metals used for the N channel and P channel transistors should be different. Thus, two different kinds of metals may be used as the metal directly on the gate dielectric. Metals that are effective for this generally are not easily deposited or etched. Two metals that have been found to be effective are titanium nitride for the P channel transistors and tantalum silicon nitride for N channel transistors. The etchants typically used for these materials, however, are not sufficiently selective to the gate dielectric and silicon substrate thus gouging may occur in the silicon substrate. This arises because in the P channel active regions, the titanium nitride is under the tantalum silicon nitride. The etch process that is used for the removal of the tantalum silicon nitride over the P channel active regions is necessary to expose the titanium nitride for subsequent etching also exposes the gate dielectric in the N channel active regions. As a consequence, the etch of the titanium nitride is also applied to the exposed gate dielectric in the N channel active regions where source/drains are to be formed. This etch of the titanium nitride may have the adverse effect of also removing the exposed gate dielectric and gouging the underlying silicon where the source/drains are to be formed.

Thus, there is a need for a process for forming dual gate transistors that solves the issues described above.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one embodiment a semiconductor device has a P channel gate stack comprising a first metal type and a second metal type over the first metal type and an N channel gate stack comprising the second metal type in direct contact with a gate dielectric. The N channel gate stack and a portion of the P channel gate stack are etched by a dry etch process. The etch of P channel gate stack is completed with a wet etch process. The wet etch is very selective to the gate dielectric and to the second metal type so that the N channel transistor is not adversely affected by completing the etch of the P channel gate stack. This is better understood with reference to the drawings and the following description.

Figure 1:
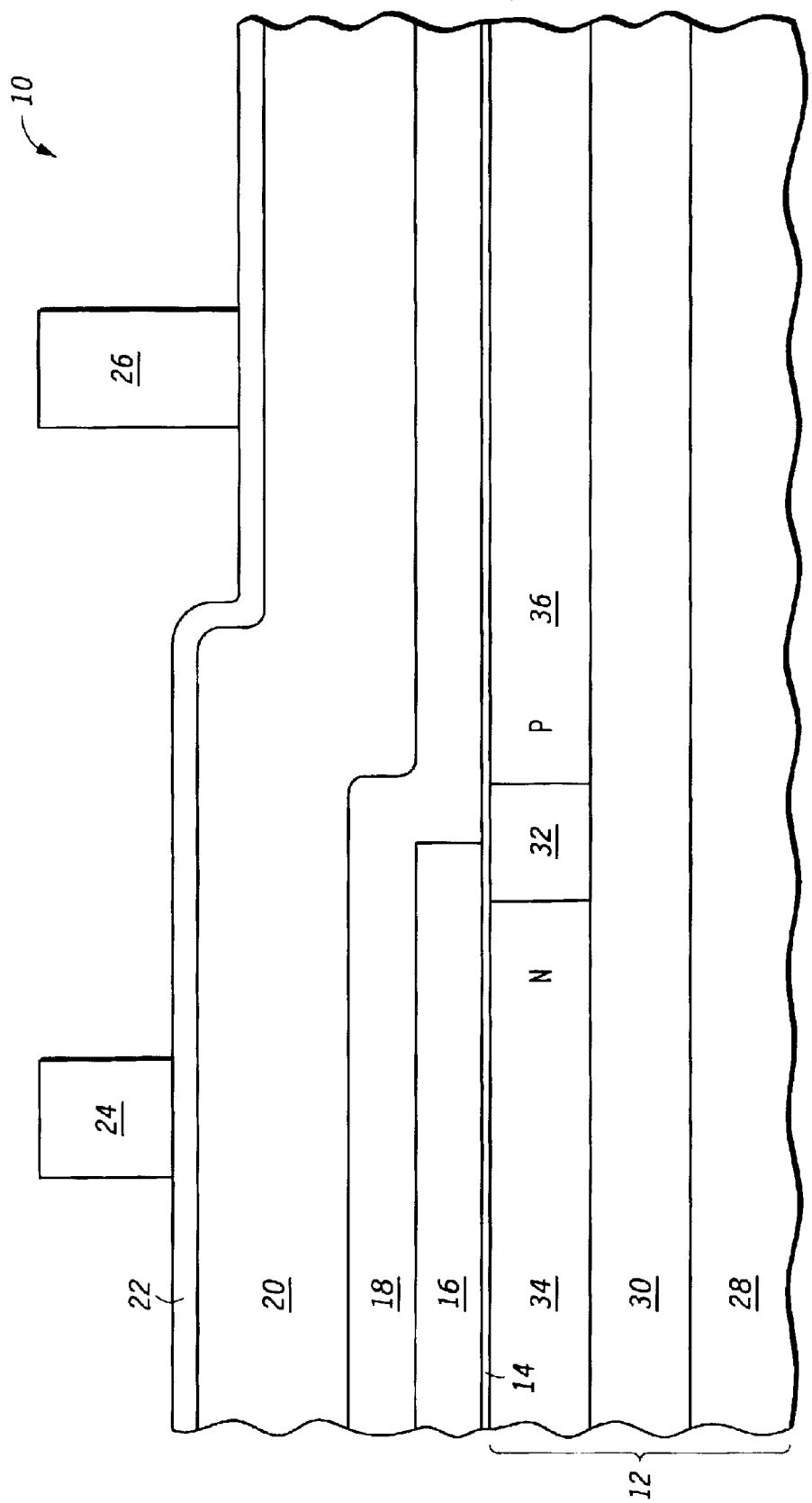
FIGS. 1–4 are cross sections of a semiconductor device according to a first embodiment of the invention at sequential stages in processing.

Shown in FIG. 1 is a semiconductor device 10 comprising a silicon on insulator (SOI) substrate 12, a gate dielectric 14 directly on a top surface of SOI substrate 12, a layer 16 of titanium nitride, a layer 18 of tantalum silicon nitride, a layer 20 of polysilicon, an antireflective coating (ARC) layer 22 of silicon-rich silicon nitride, and patterned photoresist portions 24 and 26. SOI substrate 12 has a silicon substrate 28, an insulator layer 30, an N region 34, an isolation region 32, and a P region 36. Insulating layer 30 is preferably silicon oxide but may be another insulating material. Further a bulk silicon substrate may be used instead of a SOI substrate. Layer 16 overlies N region 34 but not region 36 and is in direct contact with gate dielectric 14. Layer 18 overlies SOI substrate 12 including layer 16 and P region 36. Layer 20 overlies layer 18. Layer 22 overlies layer 20. Patterned photoresist portion 24 overlies a portion of N region 34 where a P channel gate stack is to be formed. Similarly patterned photoresist portion 26 overlies P region 36 where an N channel gate stack is to be formed.

At this point a dry etch is performed that does not penetrate through the gate dielectric 14. The thickness of layers 16 and 18 is preferably 50 Angstroms but could be as low as 30 Angstroms or could be higher than 50 Angstroms. The width of patterned photoresist portions 24 and 26, which is going to be used for determining the length of transistor gates, is preferably 500 Angstroms, about ten times the thickness of the metal layers 16 and 18. The width of isolation region 32 is about the same as the width of patterned photoresist portions 24 and 26. These dimensions can be either smaller or larger depending on the particular technology that is being used. For example, lithography challenges may limit, in production, the minimum dimension for the patterned photoresist portions 24 and 26 to be only 500 Angstroms or even 1000 Angstroms but the thicknesses of layers 16 and 18 could still be held at 50 Angstroms. ARC layer 22 is preferably 200 Angstroms thick.

Figure 2:
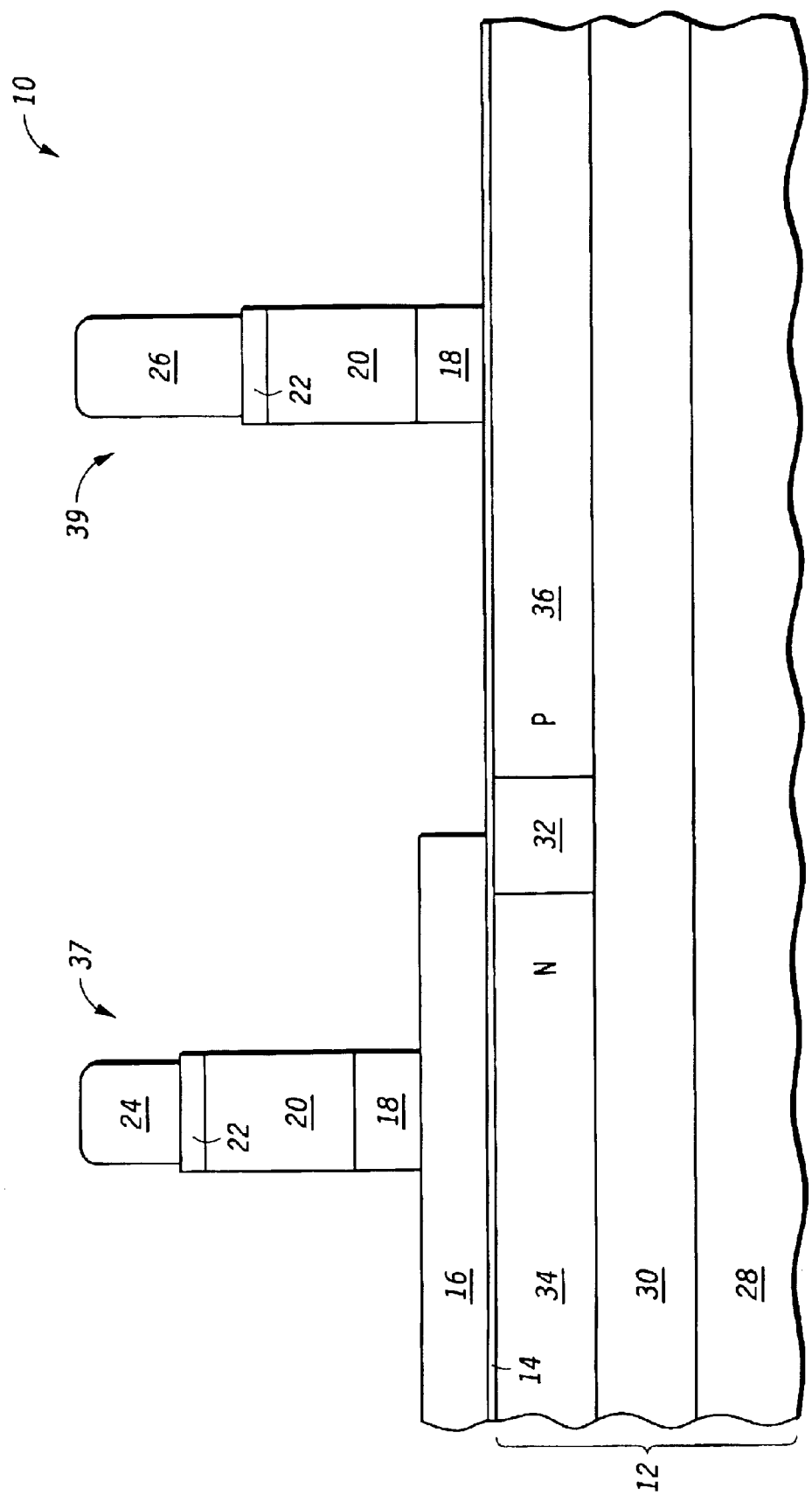

Shown in FIG. 2 is the result of the dry etch that leaves gate stacks 37 and 39 over N region 34 and P region 36, respectively. Gate dielectric 14 is exposed over P region 36 except as covered by gate stack 39. Layer 16, which is over N region 34, is exposed except as covered by gate stack 37. Patterned photoresist portions 24 and 26 may have been eroded. Both gate stacks 37 and 39 have portions of ARC 22, layer 20, and layer 18.

This dry etch which forms gate stacks 37 and 39 of FIG. 2 is preferably achieved in three etch steps. One step is for the silicon nitride ARC layer 22 and is preferably a reactive ion etch (RIE) that is halogen based. Following that is the etch of layer 20 of polysilicon by RIE in a halogen based chemistry. Following the layer 20 etch is the etch of layer 18 which is performed by RIE that is halogen based. These are conventional etches for these types of layers. The typical etch of titanium nitride is by RIE that is also halogen based. The difficulty with this is that the titanium nitride is not sufficiently selective to the gate dielectric, which in this case is preferably silicon oxynitride. Silicon oxynitride has a higher dielectric constant than silicon oxide and is more resistant to the halogen based RIE etch as well but not sufficiently resistant to avoid being penetrated by it during such an etch of titanium nitride of the needed thickness. The halogen based RIE etches vary somewhat and are ultimately determined experimentally based on the actual layers being etched. These etches of these materials are conventional and conventionally determined. If silicon oxide is used as the gate dielectric, the same etch issues are present and in fact are even worse because the typical dry etch for metal-containing materials such as those used for layers 16 and 18 is even less selective to silicon oxide than to silicon oxynitride.

The thickness of the titanium nitride is desirably thin for processing purposes but also desirably has enough thickness to be deterministic of the work function that controls the channel of the subsequently formed transistor. The gate dielectric preferably has a dielectric constant that is greater than 3.9. The optimum work function for N channel transistor gates and P channel transistor gates is generally considered to be at the silicon energy band edges, i.e., 4.1 electron volts (eV) and 5.2 eV, respectively. This is true for both bulk silicon and for partially depleted SOI. In practice this may be difficult to achieve, but preferably the N channel metal gate should have a work function of less than or equal to 4.4 eV and the P channel metal gate should have a work function of more than 4.6 eV for a partially depleted SOI substrate or bulk semiconductor substrate, which is the present case. Layer 16 of titanium nitride has a work function of 4.65 ev, and layer 18 of tantalum silicon nitride has a work function of 4.4 eV. A lesser work function differential may be satisfactory for fully depleted SOI substrates.

Thus, instead of using the conventional RIE etch to etch layer 16, a wet etch is used. The wet etch is preferably a piranha clean which is comprised of sulfuric acid and hydrogen peroxide in solution with water. Other wet etches may also be effective for this. A piranha clean is particularly beneficial because it is commonly available in a fabrication facility and is thus well understood how to apply and control. This piranha clean is very selective to both tantalum silicon nitride and silicon oxynitride, as well as silicon oxide. Thus, there is minimal etching of layer 18 and gate dielectric 14 during the removal of layer 16 that is exposed to the piranha clean. This would also be true if gate dielectric 14 were silicon oxide.

Figure 3:
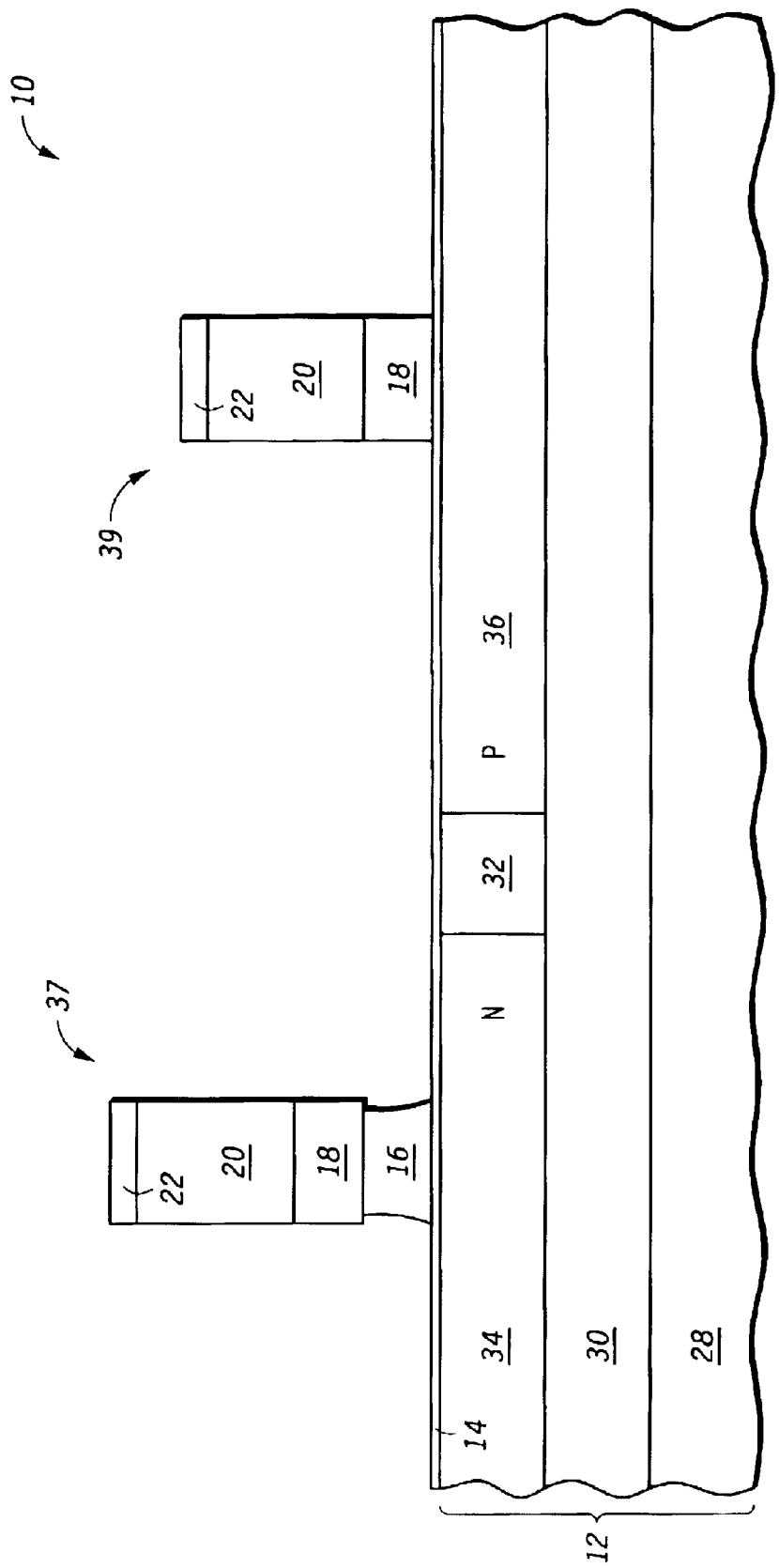

The result of the application of the piranha clean is shown in FIG. 3. This shows the completion of gate stack 37 and minimal change to gate stack 39. Patterned photoresist portions 24 and 26 are removed during this piranha clean. Removal of a material in a wet clean it is generally isotropic so that it etches laterally as well as vertically. Thus there is undercutting of layer 16 so that part of layer 16 is removed from under the portion of layer 18 that is part of gate stack 37. This undercutting is generally not greater than the thickness of the layer being etched. In this case the preferred thickness of layer 16 is 50 Angstroms so the undercutting at the interface between layers 16 and 18 could be around 50 Angstroms, which is about 10% of the gate length and with less undercutting toward the gate dielectric 14. As shown in FIG. 3, gate stacks 37 and 39 are in condition to complete the formation of transistors in a conventional manner.

Figure 4:
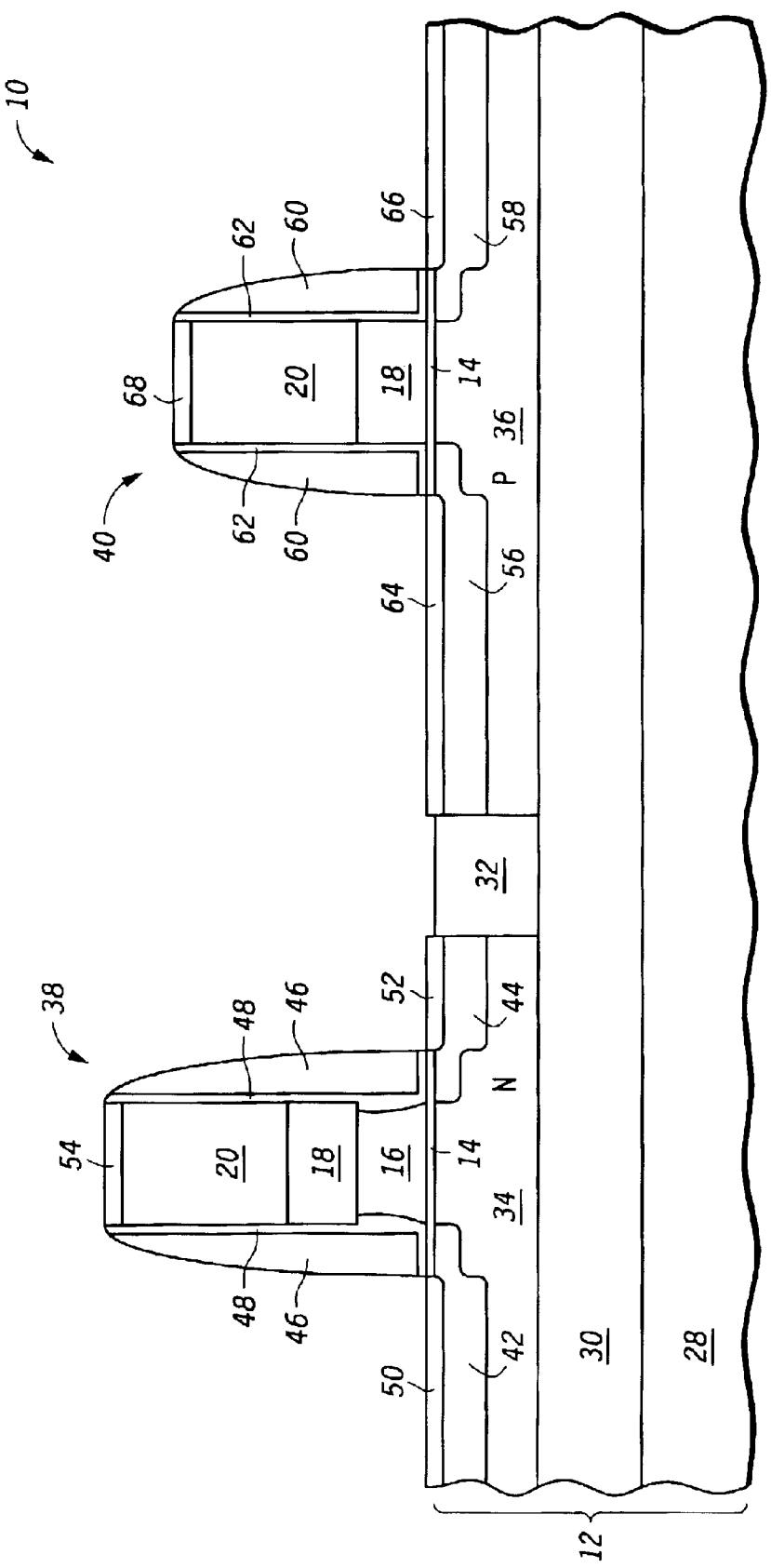

Shown in FIG. 4 are completed transistors 38 and 40 using gate stacks 37 and 39. ARC layer 22 is removed from both gate stacks 37 and 39 and transistors 38 and 40 are able to be made in conventional fashion. Transistor 38 is a P channel transistor having source/drains 42 and 44, a sidewall spacer 46, a liner 48, and silicide regions 50, 52, and 54. Silicide regions 50 and 52 are formed over and in contact with source/drains 42 and 44, respectively. Similarly, silicide region 54 is formed over and in contact with the portion of layer 20 that is part of gate stack 37 as shown in FIG. 3. Transistor 40 is an N channel transistor having source/drain regions 56 and 58, a sidewall spacer 60, a liner 62, and silicide regions 64 and 66. Silicide regions 64 and 66 are on and in contact with source/drains 56 and 58, respectively.

In the foregoing specification, the invention has been described with reference to specific embodiments. However, one of ordinary skill in the art appreciates that various modifications and changes can be made without departing from the scope of the present invention as set forth in the claims below. For example, an alternative to the device structure shown in FIG. 1 is for the overlying conductor to itself be layered or be an alloy with a graded concentration of one of the materials. Also the two different layers 16 and 18 may be different materials than that specified herein. These two layers can actually be of the same materials but having different ratios of those materials in order to achieve the desired work function differential. Further layer 18 can be deposited first so that layer 16 is over layer 18 in the P region 36 area. The result would be that the N channel transistor gate stack would have both metals instead of the P channel gate stack having both metal layers as shown in FIGS. 2–4. Another example of an alternative is to replace the overlying polysilicon layer with a material having a lower sheet resistance such as tungsten. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for forming a dual metal gate structure, comprising:

providing a semiconductor substrate having a first region and a second region, wherein the first region has a first conductivity type and the second region has a second conductivity type, different from the first conductivity type;

forming a dielectric layer overlying the first region and the second region of the semiconductor substrate;

forming a first metal-containing layer overlying the dielectric layer, wherein the first metal-containing layer overlies the first region of the semiconductor substrate;

forming a second metal-containing layer overlying the first metal-containing layer and the dielectric layer, wherein the second metal-containing layer is in direct contact with a portion of the dielectric layer overlying the second region of the semiconductor substrate;

forming a patterned masking layer overlying the second metal-containing layer to define a first gate stack and a second gate stack;

dry etching the second metal-containing layer using the patterned masking layer to form a gate electrode of the first gate stack and define sidewalls of a first portion of the second metal-containing layer over the first metal-containing layer, wherein the first portion of the second metal-containing layer is an upper portion of the second gate stack; and wet etching at least a portion of the first metal-containing layer using the first portion of the second metal-containing layer as a mask to form a gate electrode of the second gate stack under the first portion.

2. The process of claim 1, wherein one of the first and second metal-containing layers has a work function of at least 4.6 electron volts (eV) and the other one of the first and second metal-containing layers has a work function of at most 4.4 eV.

3. The process of claim 1, wherein each of the first and second metal-containing layers has a thickness of at least 30 Angstroms.

4. The process of claim 1, wherein the second metal-containing layer comprises an alloy.

5. The process of claim 1, wherein each of the first and second metal-containing layers comprise an alloy.

6. The process of claim 1, wherein wet etching the first metal-containing layer comprises wet etching through an entire thickness of the first metal-containing layer.

7. The process of claim 1, wherein wet etching is performed using a piranha clean.

8. The processing of claim 1, wherein the dielectric layer comprises a dielectric having a dielectric constant (K) of at least 3.9.

9. The process of claim 1, wherein the first conductivity type is one of N-type or P-type and the second conductivity type is another one of N-type or P-type.

10. A process for forming a dual metal gate structure, comprising:

providing a semiconductor substrate having a first region and a second region, wherein the first region has a first conductivity type and the second region has a second conductivity type, different from the first conductivity type;

forming a dielectric layer overlying the first region and the second region of the semiconductor substrate:

forming a first metal-containing layer overlying the dielectric layer, wherein the first metal-containing layer overlies the first region of the semiconductor substrate;

forming a second metal-containing layer overlying the first metal-containing layer and the dielectric layer, wherein the second metal-containing layer is in direct contact with a portion of the dielectric layer overlying the second region of the semiconductor substrate;

forming a patterned masking layer overlying the second metal-containing layer to define a first gate stack and a second gate stack;

dry etching the second metal-containing layer using the patterned masking layer to form a gate electrode of the first gate stack; and wet etching at least a first portion of the first metal-containing layer using the patterned masking layer to form a gate electrode of the second gate stack;

wherein one of the first and second metal-containing layers comprises titanium nitride (TiN) and another one of the first and second metal-containing layers comprises tantalum silicon nitride (TaSiN).

11. A process for forming a dual metal gate structure, comprising:

providing a semiconductor substrate having a first region and a second region, wherein the first region has a first conductivity type and the second region has a second conductivity type, different from the first conductivity type;

forming a dielectric layer overlying the first region and the second region of the semiconductor substrate;

forming a first metal-containing layer overlying the dielectric layer, wherein the first metal-containing layer overlies the first region of the semiconductor substrate;

forming a second metal-containing layer overlying the first metal-containing layer and the dielectric layer, wherein the second metal-containing layer is in direct contact with a portion of the dielectric layer overlying the second region of the semiconductor substrate;

forming a patterned masking layer overlying the second metal-containing layer to define a first gate stack and a second gate stack;

dry etching the second metal-containing layer using the patterned masking layer to form a gate electrode of the first gate stack;

wet etching at least a first portion of the first metal-containing layer using the patterned masking layer to form a gate electrode of the second gate stack;

forming a silicon-containing layer overlying the second metal-containing layer, wherein the patterned masking layer overlies the silicon-containing layer; and dry etching the silicon-containing layer using the patterned masking layer.

12. The process of claim 11, further comprising:

forming an anti-reflective coating (ARC) layer overlaying the silicon-containing layer, wherein the patterned masking layer overlies the ARC layer; and dry etching the ARC layer using the patterned masking layer.

13. The process of claim 12, further comprising:

forming doped regions in the first and second regions of the semiconductor substrate, adjacent the first and second gate stacks, and forming sidewall spacers adjacent the first and second gate stacks to form a first transistor and a second transistor.

14. A process for forming a dual metal gate structure, comprising:

providing a semiconductor substrate having a first region and a second region, wherein one of the first and second regions is a P region and another of the first and second regions is an N region;

forming a gate dielectric layer overlying the first region and the second region of the semiconductor substrate;

forming a first metal-containing layer overlying the dielectric layer, wherein the first metal-containing layer overlies the first region of the semiconductor substrate;

forming a second metal-containing layer overlying the first metal-containing layer and the dielectric layer, wherein the second metal-containing layer is in direct contact with a portion of the dielectric layer overlying the second region of the semiconductor substrate, and wherein one of the first and second metal-containing layers comprises titanium nitride (TiN) and another one of the first and second metal-containing layers comprises tantalum silicon nitride (TaSiN);

forming a patterned masking layer overlying the second metal-containing layer to define a first gate stack and a second gate stack;

dry etching the second metal-containing layer using the patterned masking layer to form a gate electrode of the first gate stack; and wet etching at least a portion of the first metal-containing layer using the patterned masking layer to form a gate electrode of the second gate stack.

15. The process of claim 14, wherein each of the first and second metal-containing layers has a thickness of at least 30 Angstroms.

16. The process of claim 15, wherein the first region is an N region and the second region is a P region.

17. A process for forming a dual metal gate structure comprising:
provide a semiconductor substrate having a first region and a second region, wherein the first region has a first conductivity type and the second region has a second conductivity type, different from the first conductivity type;
forming a dielectric layer overlying the semiconductor substrate;
forming a first gate stack overlying the first region, the first gate stack having a first metal-containing gate electrode overlying and in physical contact with the dielectric layer, wherein forming the first gate stack comprises wet etching a first metal-containing layer to form the first metal-containing gate electrode after dry etching a second metal-containing layer overlying the flat metal-containing layer; and
forming a second gate stack overlying the second region, the second gate stack having a second metal-containing gate electrode overlying and in physical contact with the dielectric layer, wherein forming the second gate stack comprises dry etching a second metal-containing layer to form the second metal-containing gate electrode, and wherein the first metal-containing gate electrode has a first work function and the second metal-containing gate electrode has a second work function, different from the first work function.

18. The process of claim 17, wherein one of the first and second work functions is at least 4.6 eV and another one of the first and second work functions is at most 4.4 eV.

19. The process of claim 17, wherein each of the first and second metal-containing gate electrodes has a thickness of at least 30 Angstroms.

20. The process of claim 17, wherein at least one of the first and second metal-containing gate electrodes comprises an alloy.

21. The process of claim 17, wherein the first conductivity type is one of N-type or P-type and the second conductivity type is another one of N-type or P-type.

22. The process of claim 21, wherein the first conductivity type is N-type and the second conductivity type is P-type.

23. A process for forming a dual metal gate structure comprising:
providing a semiconductor substrate having a first region and a second region, wherein the first region has a first conductivity type and the second region has a second conductivity type, different from the first conductivity type;
forming a dielectric layer overlying the semiconductor substrate;
forming a first gate stack overlying the first region, the first gate stack having a first metal-containing gate electrode overlying and in physical contact with the dielectric layer, wherein forming the first gate stack comprises wet etching a first metal-containing layer to form the first metal-containing gate electrode; and
forming a second gate stack overlying the second region, the second gate stack having a second metal-containing gate electrode overlying and in physical contact with the dielectric layer, wherein forming the second rate stack comprises dry etching a second metal-containing layer to form the second metal-containing gate electrode, and wherein the first metal-containing gate electrode has a first work function and the second metal-containing gate electrode has a second work function, different from the first work function;
wherein forming the first gate stack further comprises forming a first silicon-containing portion overlying the first metal-containing gate electrode and forming a first ARC portion overlying the first silicon-containing portion, and wherein forming the second gate stack further comprises forming a second silicon-containing portion overlying the second metal-containing gate electrode and forming a second ARC portion overlying the second silicon-containing portion.

24. A process for forming a dual metal gate structure comprising:
providing a semiconductor substrate having a first region and a second region, wherein the first region has a first conductivity type and the second region has a second conductivity type, different from the first conductivity type;
forming a dielectric layer overlying the semiconductor substrate;
forming a first gate stack overlying the first region, the first gate stack having a first metal-containing gate electrode overlying and in physical contact with the dielectric layer, wherein forming the first gate stack comprises wet etching a first metal-containing layer to form the first metal-containing gate electrode; and
forming a second gate stack overlying the second region, the second gate stack having a second metal-containing gate electrode overlying and in physical contact with the dielectric layer, wherein forming the second gate stack comprises dry etching a second metal-containing layer to form the second metal-containing gate electrode, and wherein the first metal-containing gate electrode has a first work function and the second metal-containing gate electrode has a second work function, different from the first work function;
wherein one of the first and second metal-containing gate electrodes comprises titanium nitride (TiN) and another one of the first and second metal-containing gate electrodes comprises tantalum silicon nitride (TaSiN).

* * * * *

UNITED STATES PATENT AND TRADEMARK OFFICE
CERTIFICATE OF CORRECTION

PATENT NO. : 6,790,719 B2
DATED : September 14, 2004
INVENTOR(S) : Olubunmi O. Adetutu et al.

It is certified that error appears in the above-identified patent and that said Letters Patent is hereby corrected as shown below:

Column 8,
Line 10, delete "rate" and replace with -- gate --.

Signed and Sealed this

Twenty-eighth Day of March, 2006

JON W. DUDAS
*Director of the United States Patent and Trademark Office*